United States Patent
Lankhorst et al.

(10) Patent No.: US 7,307,267 B2
(45) Date of Patent: Dec. 11, 2007

(54) ELECTRIC DEVICE WITH PHASE CHANGE MATERIAL AND PARALLEL HEATER

(75) Inventors: Martijn Henri Richard Lankhorst, Eindhoven (NL); Erwin Rinaldo Meinders, Eindhoven (NL); Robertus Adrianus Maria Wolters, Eindhoven (NL); Franciscus Petrus Widdershoven, Leuven (BE)

(73) Assignee: NXP B.V., Eindhoven (NL)

( * ) Notice: Subject to any disclaimer, the term of this patent is extended or adjusted under 35 U.S.C. 154(b) by 245 days.

(21) Appl. No.: 10/539,102

(22) PCT Filed: Dec. 5, 2003

(86) PCT No.: PCT/IB03/05740

§ 371 (c)(1),
(2), (4) Date: Jun. 15, 2005

(87) PCT Pub. No.: WO2004/057676

PCT Pub. Date: Jul. 8, 2004

(65) Prior Publication Data
US 2006/0208847 A1    Sep. 21, 2006

(30) Foreign Application Priority Data
Dec. 19, 2002 (EP) ................. 02080430
Mar. 7, 2003 (EP) ................. 03100583
Sep. 10, 2003 (EP) ................. 03103340

(51) Int. Cl.
*H01L 29/02* (2006.01)
(52) U.S. Cl. .................. 257/2; 257/3; 257/246; 257/E27.004; 438/466; 438/95; 438/900; 365/100; 365/145; 338/9; 338/195

(58) Field of Classification Search ............ 257/2; 438/900; 338/9, 195
See application file for complete search history.

(56) References Cited

U.S. PATENT DOCUMENTS

| | | | | |
|---|---|---|---|---|
| 3,846,767 | A * | 11/1974 | Cohen ................ | 327/198 |
| 5,761,115 | A * | 6/1998 | Kozicki et al. ........ | 365/182 |
| 5,858,533 | A * | 1/1999 | Greuter et al. ........ | 428/404 |
| 5,933,365 | A * | 8/1999 | Klersy et al. ........ | 365/148 |
| 6,087,674 | A * | 7/2000 | Ovshinsky et al. ..... | 257/2 |
| 6,314,014 | B1 * | 11/2001 | Lowrey et al. ........ | 365/100 |
| 2002/0017701 | A1 * | 2/2002 | Klersy et al. ........ | 257/536 |
| 2002/0039310 | A1 | 4/2002 | Chiang et al. | |
| 2005/0265072 | A1 * | 12/2005 | Hart et al. .......... | 365/163 |

FOREIGN PATENT DOCUMENTS
EP    1 331 675    7/2003

* cited by examiner

*Primary Examiner*—Jerome Jackson
*Assistant Examiner*—Jami M Valentine
(74) *Attorney, Agent, or Firm*—Peter Zawilski (57) ABSTRACT

The electric device (1, 100) has a body (2, 102) having a resistor (7, 107) comprising a phase change material being changeable between a first phase and a second phase. The resistor (7, 107) has a first electrical resistance when the phase change material is in the first phase and a second electrical resistance, different from the first electrical resistance, when the phase change material is in the second phase. The body (2, 102) further has a heating element (6, 106) being able to conduct a current for enabling a transition from the first phase to the second phase. The heating element (6, 106) is arranged in parallel with the resistor (7, 107).

12 Claims, 8 Drawing Sheets

ELECTRIC DEVICE WITH PHASE CHANGE MATERIAL AND PARALLEL HEATER

The invention relates to an electric device with a body having a resistor comprising a phase change material being changeable between a first phase and a second phase, the resistor having a first electrical resistance when the phase change material is in the first phase and a second electrical resistance, different from the first electrical resistance, when the phase change material is in the second phase, and a heating element being able to conduct a current for enabling a transition from the first phase to the second phase.

U.S. Pat. No. 5,933,365 discloses an embodiment of an electric device having a resistor comprising a phase change material which is able to be in a first, e.g. crystalline, phase and a second, e.g. amorphous, phase. The resistor with the phase change material in the first phase and the resistor with the phase change material in the second phase have different values of the electrical resistance. The first phase and/or the second phase may be partly amorphous and partly crystalline. In the remainder the terms "crystalline" and "amorphous" are used to refer to a crystalline phase or a mainly crystalline phase, and to an amorphous phase or a mainly amorphous phase, respectively.

The resistor is electrically connected to a first conductor and a second conductor such that the value of the electrical resistance can be measured. The resistor, the first conductor and the second conductor are able to conduct a current which, via heating, enables transitions of the phase change material between the first phase and the second phase. It is believed that for a transition from a phase with a relatively good conductivity such as a crystalline phase or a mainly crystalline phase, to a phase with a relatively poor conductivity such as an amorphous phase or a mainly amorphous phase, heating by a sufficiently strong current melts the phase change material. The heating ends when switching off the current. The phase change material then cools down and assumes a more amorphous order.

When inducing a transition from a phase with a relatively low electric conductivity to a phase with a relatively high electric conductivity, the heating is initially counteracted by the poor conductivity, which limits the current conducted through the phase change material. It is believed that by applying a sufficiently high voltage, i.e. a voltage higher than the so-called threshold voltage, across the resistor it is possible to locally induce an electrical breakdown in the phase change material, which leads to a high local current density. The corresponding heating is then sufficient to increase the temperature of the phase change material to above its crystallization temperature, thereby enabling the phase transition from the amorphous phase to the crystalline phase.

In the known electric device the heating is at least partly achieved by one or more heating layers. The heating layers are thin-film structures deposited adjacent to the phase change material. They are part of the first conductor and the second conductor, respectively. The one or more heating layers are electrically connected in series with the resistor and, when conducting an electric current, they heat the resistor by Joule heating. They are designed to reduce the electric energy required to induce a transition between the first phase and the second phase.

The known electric device is an electrically writable and erasable memory cell, which carries information encrypted in the value of the electrical resistance. The memory cell is assigned, e.g., a "0" when the resistance is relatively low and a "1" when the resistance is relatively high. The resistance may be easily measured by supplying a voltage across the resistor and measuring the corresponding current. The memory element is written and erased by inducing a transition from a first phase to a second phase as described above.

It is a disadvantage of the known electric device that the electric device deteriorates when repeatedly switched between the first phase and the second phase, i.e. the lifetime, also called life span or endurance, of the electric device is limited.

It is an object of the invention to provide an electric device as described in the opening paragraph which has a relatively good endurance.

The invention is defined by the independent claims. The dependent claims define advantageous embodiments.

According to the invention this object is realized in that the heating element is arranged in parallel with the resistor. The invention is based on the insight that the endurance of the known electric device is limited because the switching operation requires an electrical breakdown induced by a voltage larger than the threshold voltage. Repeatedly inducing an electrical breakdown results in a deterioration of the phase change material, in particular at the interface between the phase change material and the heating layer.

In the electric device according to the invention the Joule heating by the heating element is effective even when the phase change material is in the amorphous phase because the heating element is arranged in parallel with the resistor. When the phase change material is in the amorphous phase, a voltage applied to the resistor leads to a current flowing at least partly through the heating element, thereby leading to effective heating of the phase change material without requiring an electrical breakdown. This heating promotes the phase change, thereby improving the endurance of the electric device.

In an embodiment the heating element has a heating element electrical resistance $R_H$ which is smaller than the first electrical resistance and the second electrical resistance, i.e. which is in particular smaller than the electrical resistance $R_{R,A}$ of the resistor with the phase change material in the amorphous phase. As a consequence the current mainly flows through the heating element when the phase change material is in the amorphous phase. It is advantageous if the heating element electrical resistance $R_H$ is a factor of ten or more smaller than the electrical resistance $R_{R,A}$. When inducing the phase transition is controlled by the current through the electric device the following holds: the smaller the heating element electrical resistance $R_H$ with respect to the electrical resistance $R_{R,A}$, the higher the current flowing through the heating element and the higher the corresponding Joule heating. When inducing the phase transition is controlled by the voltage across the resistor, the parallel heating element has the advantage that a lower voltage can be used. The smaller the heating element electrical resistance $R_H$ with respect to the electrical resistance $R_{R,A}$, the smaller is the required voltage across the heating element and the resistor. At a lower voltage the Joule heating required for inducing the phase change is then achieved by a higher current through the heating element. This has particular advantages when the electric device is integrated in an advanced IC process in which the voltage is relatively low. At the same time the electric current through the phase change material is reduced, thereby reducing electro-migration in the phase change material, thus leading to an improved endurance.

In the embodiment described in the previous paragraph a phase transition is induced without an electrical break down in the phase change material. Repeatedly switching a phase change material by an electrical breakdown deteriorates the electric device, in particular for phase change materials comprising relatively reactive atoms such as e.g. Te. Therefore, an electric device according to this embodiment of the invention, in which the electrical breakdown is avoided, has an improved endurance.

Another disadvantage associated with switching by electrical breakdown is that the electrical breakdown is a statistical process. Thus the value of the breakdown voltage is a statistical parameter as well, which may depend on temperature and the time elapsed since the last switching. In order to assure reliable switching, a voltage well above the average threshold voltage has to be applied in the known electric device. However, the voltages available with CMOS devices decrease with a decrease in dimensions of the CMOS device. Thus, future electric devices should be reliably operated at relatively low voltages. In the electric device according to this embodiment of the invention, electrical breakdown is not required and a voltage below the threshold voltage is sufficient to induce a phase transition.

A preferred lower limit of the heating element electrical resistance $R_H$ is that it is larger than 0.3 times the minimum of the first electrical resistance and the second electrical resistance, i.e. larger than 0.3 times the electrical resistance $R_{R,C}$ of the resistor with the phase change material in the crystalline phase. An electric device fulfilling this condition has the advantage that the change of the resistance is reliably measurable.

In the electric device according to the invention the resistor and the heating element are connected in parallel. The total electrical resistance $R_T$ of these two elements is then given by $R_T = R_R * R_H / (R_R + R_H)$. The electrical resistance $R_R$ of the resistor depends on the phase of the phase change material whereas the heating element electrical resistance $R_H$ is independent of the phase of the phase change material. In the case that the heating element electrical resistance $R_H$ is much smaller than the electrical resistance $R_{R,A}$, the total electrical resistance $R_{T,A}$ with the phase change material in the amorphous phase is approximately equal to $R_H$.

If a scaling factor k is defined by $R_H = k * R_{R,C}$, the total electrical resistance $R_{T,C}$ with the phase change material in the crystalline phase is $R_{T,C} = R_{R,C} * k/(k+1)$. The change of the total resistance is $\Delta R_T = R_{T,A} - R_{T,C} \approx R_H - R_{T,C} = (k - k/(k+1)) * R_{R,C} = R_{R,C} * k^2/(k+1)$. Within this approximation the relative change of the total resistance is $\Delta R_T / R_{T,C} = k$. The smaller the relative change of the total resistance, the more difficult it is to reliably measure it. A smaller relative change of the total resistance typically requires a more sophisticated detection circuit and/or a longer measurement time. The inventors have established that a relative change of 0.3, i.e. of 30%, or more is relatively easily measurable in a relatively short time.

Preferably, the scaling factor k should be between 1 and 4, i.e. $1 \leq k \leq 4$ because then the detection of the change of the total resistance $\Delta R_T$ is relatively robust while at the same time the Joule heating by the heating element is relatively effective.

It is advantageous if the heating element and the resistor are in direct contact because then the Joule heating by the heating element is particularly effective.

In an embodiment the phase change material constitutes a conductive path between a first contact area and a second contact area, a cross-section of the conductive path being smaller than the first contact area and the second contact area. Here, the term "contact area" defines the area in which the phase change material is electrically connected to an electric conductor such as the first conductor or the second conductor, which is composed of a material other than the phase change material. In the known device the phase change material is located in an aperture. The contact area and the cross-section of the conductive path are both equal to the cross-section of the aperture, i.e. the contact area is equal to the cross-section of the conductive path. In the known device the phase change occurs in a volume of the phase change material, which comprises this contact area. At the interface, i.e. at this contact area, repetitive phase changes and the corresponding high current densities cause a deterioration of the material, which leads to a deterioration of the electric device, in particular when the phase change material comprises relatively reactive atoms such as Te. In the electric device according to this embodiment, the minimum cross-section of the conductive path is well inside the phase change material and, unlike in the known electric device, is not identical to the contact area. The current density is then highest inside the phase change material and, therefore, the Joule heating is more effective inside the phase change material. This reduces the interactions between the phase change material and the other materials at the interface, i.e. at the first contact area and/or the second contact area, leading to an improved endurance.

In an embodiment a part of the conductive path having said cross-section constitutes a volume of phase change material, the volume having an electrical resistance which is larger than an electrical contact resistance at the first contact area and/or at the second contact area, independent of whether the phase change material is in the first phase or the second phase. In such an electric device the Joule heating at the first contact area and/or at the second contact area are each smaller than the Joule heating inside the volume of the phase change material where the current density is high. This further reduces the interactions between the phase change material and the other materials at the first contact area and/or the second contact area, leading to an improved endurance. An additional advantage is that the electric power is dissipated, i.e. converted to heat, mainly at the location where the phase change occurs. By reducing the dissipation at positions where the phase change does not occur the total electric power required for inducing a phase transition is reduced.

Preferably, the electrical resistance of the volume is larger than the electrical contact resistance at both the first contact area and the second contact area, independent of whether the phase change material is in the first phase or the second phase. In this case, it is assured that the phase change occurs in the volume, which is inside the phase change material.

Preferably, the contact resistance at the first contact area and at the second contact area are smaller than $10^{-7}$ V cm$^2$/A because then the dissipation at the first contact area and at the second contact area is relatively small.

In an embodiment the heating element material is of a composition $X_{100-(t+s)}Si_sY_t$, where t and s denote atomic percentages satisfying t<0.7 and s+t>0.3, and X comprises one or more elements selected from Ti and Ta, and Y comprises one or more elements selected from C and N. Preferably, X is substantially free from Ti because Ta is less reactive with the phase change material than Ti. Preferably, s is smaller than or equal to 0.7 because otherwise the conductivity of the parallel heater is relatively low, which requires a relatively large parallel heater. When the phase change material comprises Ge, mixing of Ge and Si is reduced when s is smaller than or equal to 0.7. It is further advantageous if Y comprises N because the heating element material usually has a polycrystalline structure which is stabilized by the nitrogen atoms, i.e. the polycrystalline structure is changed to a relatively small extent when heating the phase change material.

In an embodiment the resistor constitutes a memory element, and the body comprises an array of memory cells, each memory cell comprising a respective memory element and a respective selection device, and a grid of selection lines, each memory cell being individually accessible via the respective selection lines connected to the respective selection device. The selection device may comprise a bipolar transistor or a diode such as, e.g. a pn diode. Such an electric device is a random access memory (RAM) device which is suited as a non-volatile memory device.

In a preferred variation of this embodiment the selection device comprises a metal oxide semiconductor field effect transistor (MOSFET) having a source region, a drain region and a gate region, and the grid of selection lines comprises N first selection lines, M second selection lines, N and M being integers, and an output line, the resistor of each memory element electrically connecting a first region selected from the source region and the drain region of the corresponding metal oxide semiconductor field effect transistor to the output line, a second region of the corresponding metal oxide semiconductor field effect transistor selected from the source region and the drain region and being free from contact with the first region, being electrically connected to one of the N first selection lines, the gate region being electrically connected to one of the M second selection lines. In such a memory device the memory elements are selected by a MOSFET which allows for relatively high operating speed and a relatively low operating voltage.

These and other aspects of the electric device according to the invention will be further elucidated and described with reference to the drawings, in which.

The Figures are not drawn to scale.

Figure 1:
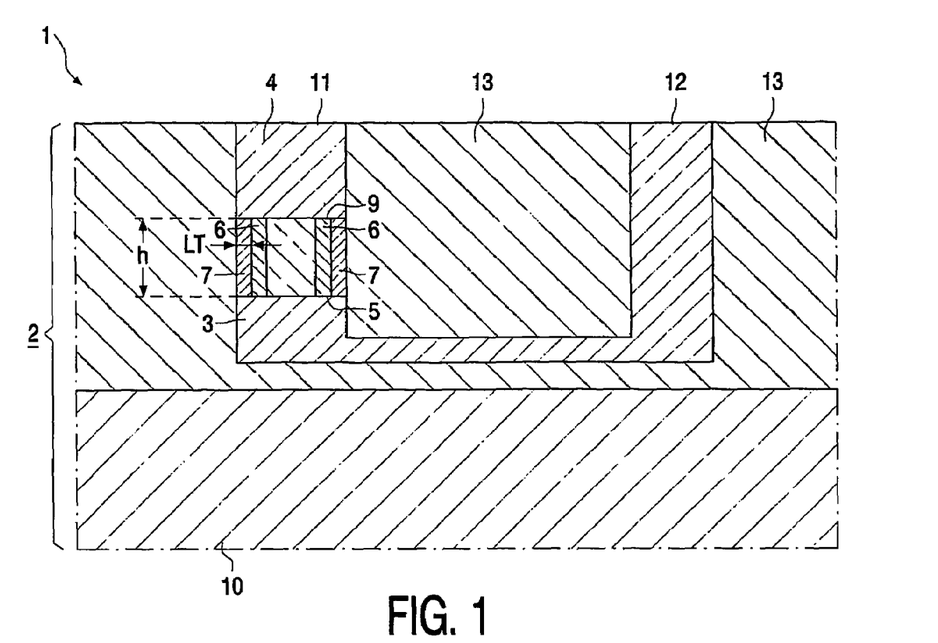
FIG. 1 is a cross-section of an embodiment of the electric device.

The electric device 1, shown in FIG. 1, has a body 2 which comprises a substrate 10 which may comprise, e.g., a single crystal p-doped silicon semiconductor wafer. On a main surface of the substrate 10 a resistor 7 is embedded in a dielectric 13, e.g., silicon oxide. The resistor 7 is composed of a phase change material being changeable between a first phase and a second phase. The resistor 7 has a first electrical resistance when the phase change material is in the first phase and a second electrical resistance, different from the first electrical resistance, when the phase change material is in the second phase.

In one embodiment the phase change material is a composition of formula $Sb_{1-c}M_c$, with c satisfying $0.05 \leq c \leq 0.61$, and M being one or more elements selected from the group of Ge, In, Ag, Ga, Te, Zn and Sn. An electric device with a phase change material of this composition is described in the non-pre-published European Patent Application with number 03100583.8 (PHNL030259) the priority of which is claimed by this application and which is incorporated herein by reference in its entirety. Preferably, c satisfies $0.05 \leq c \leq 0.5$. Even more preferably, c satisfies $0.10 \leq c \leq 0.5$. A group of advantageous phase change materials has one or more elements M other than Ge and Ga in concentrations which in total are smaller than 25 atomic percent and/or comprises in total less than 30 atomic percent of Ge and/or Ga. Phase change materials comprising more than 20 atomic percent of Ge and Ga and one or more elements selected from In and Sn in concentrations which in total are between 5 and 20 atomic percent have a relatively high crystallization speed and at the same time a relatively high stability of the amorphous phase.

In an embodiment the phase change material is a composition of formula $Sb_a Te_b X_{100-(a+b)}$, with a, b and $100-(a+b)$ denoting atomic percentages satisfying $1 \leq a/b \leq 8$ and $4 \leq 100-(a+b) \leq 22$, and X being one or more elements selected from Ge, In, Ag, Ga and Zn. The phase change material may be, e.g., $Sb_{72}Te_{20}Ge_8$.

In yet another embodiment the phase change material is a composition of formula $(Te_a Ge_b Sb_{100-(a+b)})_c TM_{100-c}$, where the subscripts are in atomic percentages, a is below 70 percent, b is above 5 percent and below 50 percent, c is between 90 and 99.99 percent, and TM denotes one or more transition metal elements. Alternatively, the transition metal is omitted and the phase change material is a composition of formula $Te_a Ge_b Sb_{100-(a+b)}$ where the subscripts are in atomic percentages, a is below 70 percent and b is above 5 percent and below 50 percent, such as, e.g., $Ge_2 Sb_2 Te_5$. Other examples of the phase change material are $Te_{81}Ge_{15}S_2As_2$ and $Te_{81}Ge_{15}S_2Sb_2$.

The phase change material may be deposited by sputtering as described in the article "Phase-change media for high-numerical-aperture and blue-wavelength recording" by H. J. Borg et al., Japanese Journal of Applied Physics, volume 40, pages 1592-1597, 2001.

The body 2 further has a heating element 6 being able to conduct a current for enabling a transition from the first phase to the second phase. The heating element 6 is arranged in parallel with the resistor 7. In the embodiment of FIG. 1 the resistor 7 and the heating element 6 join a first contact area 5 and a second contact area 9.

The heating element 6 is composed of a heating element material with a melting point higher than that of the phase change material. The melting point of the heating element material is preferably at least 100 degrees Celsius, more preferably at least 250 degrees Celsius higher than that of the phase change material. Preferably, the heating element material does not react with the phase change material. Preferably, the resistivity of the heating element material is in the range of 0.1 to 10 cm mV/A. When the phase change material is selected from the class of $Te_a Ge_b Sb_{100-(a+b)}$, where the subscripts are in atomic percentages, a is below 70 percent and b is above 5 percent and below 50 percent, the phase change material has a resistivity of 1 to 4 cm mV/A, e.g. 2 cm mV/A, and the resistivity of the heating element material is preferably between 0.5 and 20 cm mV/A. When the phase change material is selected from the class of $Sb_{1-c}M_c$, with c satisfying $0.05 \leq c \leq 0.61$, and M being one or more elements selected from the group of Ge, In, Ag, Ga, Te, Zn and Sn, the phase change material has a resistivity of approximately 0.2 to 0.8 cm mV/A and the resistivity of the heating element material is preferably between 0.1 and 4 cm mV/A.

In this embodiment the heating element material is of a composition $X_{100-(t+s)}Si_sY_t$, where t and s denote atomic percentages satisfying t<0.7 and s+t>0.3, and X comprises one or more elements selected from Ti and Ta, and Y comprises one or more elements selected from C and N. Preferably, X is substantially free from Ti because Ta is less reactive with the phase change material than Ti. Preferably, s is smaller than or equal to 0.7 because otherwise the conductivity of the parallel heater is relatively low, which requires a relatively large parallel heater. When the phase change material comprises Ge, mixing of Ge and Si are reduced when s is smaller than or equal to 0.7. It is further advantageous if Y comprises N because the heating element material usually has a polycrystalline structure which is stabilized by the nitrogen atoms, i.e. the polycrystalline structure is changed to a relatively small extent when heating the phase change material. Examples of this class of heating element material are TaSiN, $Ta_{20}Si_{40}N_{40}$, TiSiN or $Ta_{20}Si_{40}C_{40}$. Alternatively, the heating element material may be composed of TiN, $TaSi_2$, $TaN_x$, where x satisfies 0.3<x<0.7, TiAlN, TiC, TiWC or, e.g. p-doped polycrystalline silicon.

The body 2 further comprises a first conductor 3 of, e.g., tantalumdisilicide ($TaSi_2$) which is electrically connected to the first contact area 5, and a second conductor 4 of titanium nitride (TiN), which is electrically connected to the second contact area 9. In volumes relatively remote from the first contact area 5 and the second contact area 9 the first conductor 3 and the second conductor 4 may comprise a material having a relatively good electric conductivity such as, e.g., tungsten, aluminum or copper to increase the electric conductivity of the first conductor 3 and the second conductor 4. The first conductor 3 and the second conductor 4 have contact pads 11 and 12, respectively, which allow for conducting a current through the first conductor 3, the second conductor 4, the resistor 7 and the heating element 6 for heating of the phase change material to enable a transition from the first phase to the second phase.

In the embodiment shown in cross-section in FIG. 1 the resistor 7 is arranged at the inner surface of a contact hole in dielectric 13. The contact hole may have a cylindrical shape with a diameter d between 25 and 250 nm and a height h between 25 and 300 nm. The phase change material may be deposited by sputtering as descried in the article "Phase-change media for high-numerical-aperture and blue-wavelength recording" by H. J. Borg et al., Japanese Journal of Applied Physics, volume 40, pages 1592-1597, 2001. Preferably, the phase change material has a layer thickness LT of 3 to 25 nm. The heating element 6 is arranged at the inner surface of the contact hole after the contact hole has been provided with the phase change material. Preferably, the heating element material of heating element 6 has a layer thickness MT of 3 to 15 nm. In the embodiment shown in FIG. 1 the heating element 6 and the resistor 7 are in direct contact.

In one embodiment the contact hole has a diameter d of 40 nm and a height h of 50 nm, the layer of phase change material is of composition $Ge_2Sb_2Te_5$ and has a layer thickness LT of 5 nm, the heating element 6 is of composition $Ta_{20}Si_{40}N_{40}$ and has a layer thickness MT of 5 nm. It is arranged inside the contact hole as depicted in FIG. 1. The heating element 6 has a heating element electrical resistance of approximately 1400 Ohm. In the crystalline phase and in the amorphous phase this resistor 7 has a first electrical resistance of approximately 1600 Ohm and a second electrical resistance which is larger than 100 kOhm, respectively. Thus, the heating element electrical resistance is smaller than the maximum of the first electrical resistance and the second electrical resistance and larger than 0.3 times the minimum of the first electrical resistance and the second electrical resistance.

In another embodiment the geometrical dimensions of the contact hole, the phase change material and the heating element are the same but the heating element 6 is of composition $Ta_{40}Si_{50}N_{10}$. The heating element electrical resistance is then approximately 160 Ohm and thus smaller than 0.3 times the minimum of the first electrical resistance and the second electrical resistance.

In an alternative embodiment the resistor 7 and the heating element 6 are interchanged, i.e. the heating element 6 is provided to the inner surface of the contact hole and subsequently, the resistor 7 is provided on top of the heating element 6. In another embodiment, not shown, the heating element 6 is separated from the resistor 7 by an intermediate layer which may comprise, e.g., silicon dioxide. The intermediate layer may be an insulator or an electric conductor. It is advantageous if the intermediate layer separating the phase change layer from the parallel heater layer is an insulator because in this way it is prevented that the distribution of the current between the phase change layer and the parallel heater changes along the path of the current. As a result a uniform change of the phase change along the path of the current may be obtained. The intermediate layer may reduce and, preferably, prevent mixing of the phase change material with the electric heater material. Preferably, the thickness of the intermediate layer is small enough to have no significant influence on the heating efficiency of the parallel heater. Preferably, the thickness of the intermediate layer, i.e. the distance between the heating element and the resistor is less than 5 nm. Preferably, the thickness is between 1 and 3 nm. The intermediate layer may be composed of zinc sulfide quartz ($ZnS$—$SiO_2$) and/or silicon nitride.

In another embodiment of the electric device 100, shown in FIGS. 2-9 at various stages of the manufacturing process, the resistor constitutes a memory element 170, and the body 102 comprises a semiconductor substrate 101 which may comprise, e.g., a single crystal p-doped silicon semiconductor wafer, and an array of memory cells, each memory cell comprising a respective memory element 170 and a respective selection device 171. In the embodiment shown in FIGS. 2-9 the electric device 100 has a 3×3 array but the invention is not limited to an array of this size nor to an array of this shape. The body 102 further comprises a grid of selection lines 120, 121 such that each memory cell is individually accessible via the respective selection lines 120, 121 connected to the respective selection device 171.

In the embodiment shown in FIGS. 2-9 the selection device 171 comprises a metal oxide semiconductor field effect transistor (MOSFET), and more specifically an NMOS transistor. The MOSFET has n-doped source regions 172, n-doped drain regions 173, and gate regions 174. The source regions 172 and the drain regions 173 may comprise more than one portion of n-doped material, namely a lightly doped n-portion and a more heavily doped n+ portion. The n-doped source region 172 and the drain region 173 are separated by a channel region. The gate region 174, formed above the channel region, controls the flow of current from the source region 172 to the drain region 173 through the channel region. The gate region 174 preferably comprises a layer of polycrystalline silicon. The gate region 174 is separated from the channel region by a gate dielectric layer.

The grid of selection lines 120, 121 comprises N=3 first selection lines 120 and M=3 second selection lines 121, and an output line. The resistor 107 of each memory element electrically connects a first region selected from the source region 172 and the drain region 173 of the corresponding MOSFET to the output line. A second region of the corresponding MOSFET selected from the source region 172 and the drain region 173 and being free from contact with the first region, is electrically connected to one of the N first selection lines 120. The gate region 174 is electrically connected to one of the M second selection lines 121. In the embodiment shown in FIGS. 2-9 the first region is the source region 172 and the second region is the drain region 173. In another embodiment (not shown) the first region is the drain region 173 and the second region is the source region 172. The selection lines 120, 121 are connected to line selection devices and row selection devices, respectively. These latter selection devices are not shown.

The gate region 174 and the drain region 173 are provided with layers of tungsten silicide and tungsten plugs 122 for electrically connecting the gate region 174 and the drain region 173 to the selection lines 121 and 120, respectively. The selection lines 120 and 121 are formed from a conductive material such as, e.g., aluminum or copper. The source region 172 is provided with a layer of tungsten silicide and a tungsten plug as well.

Figure 2:
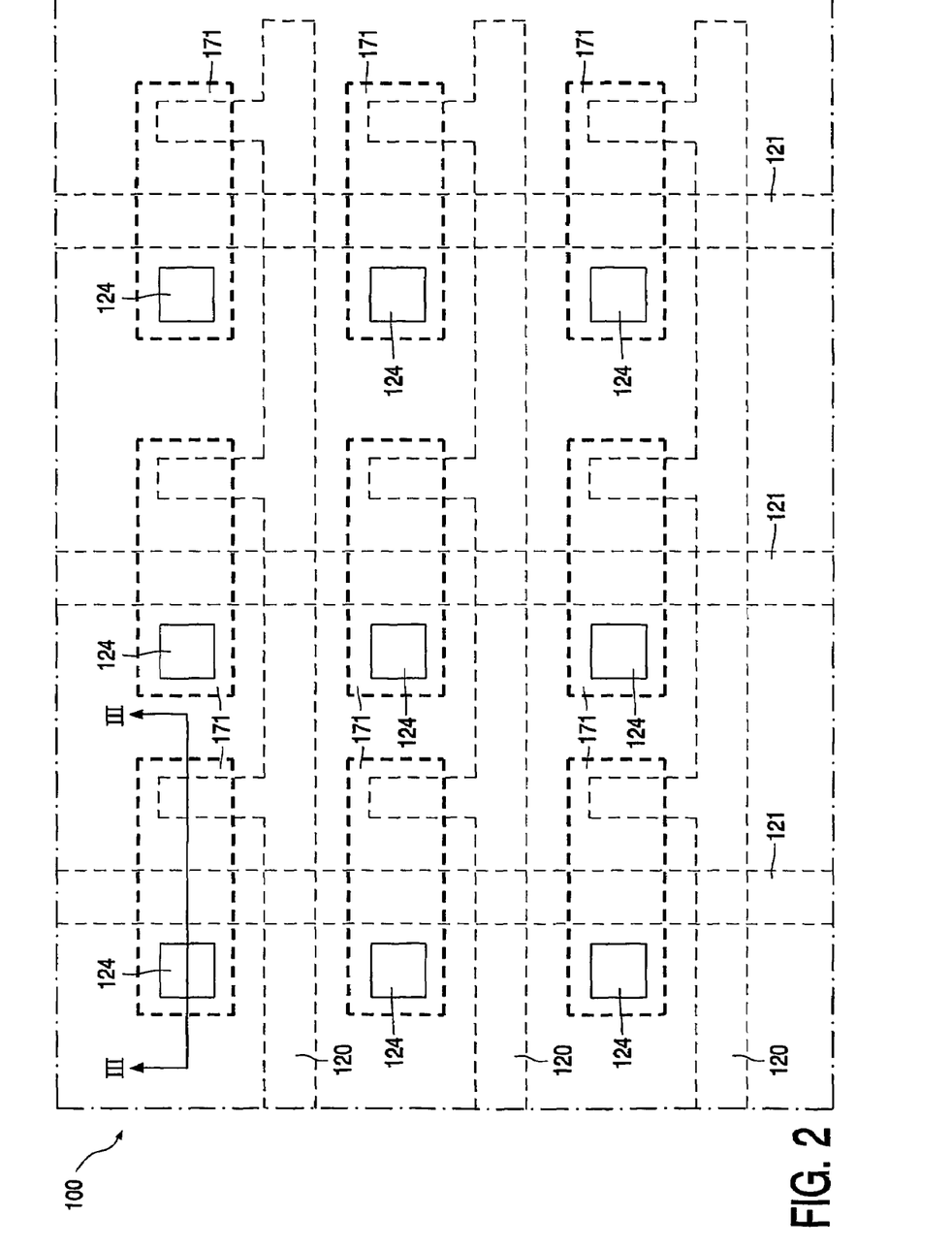
FIG. 2 is a top view of another embodiment of the electric device at a first stage of the manufacturing.
Figure 3:
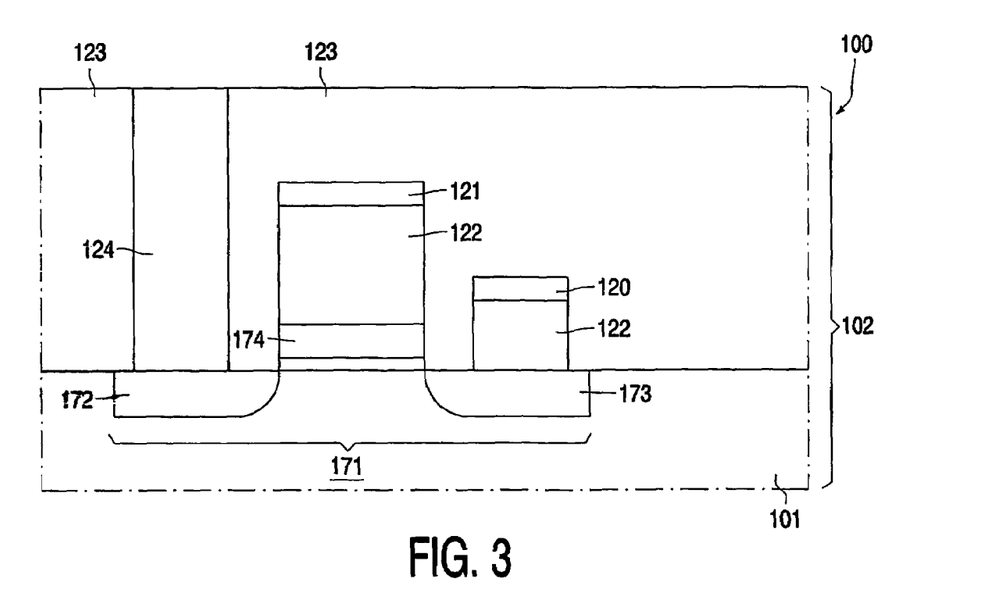
FIG. 3 is a cross-section of the pre-fabricated electric device of FIG. 2 along line III-III.
Figure 4:
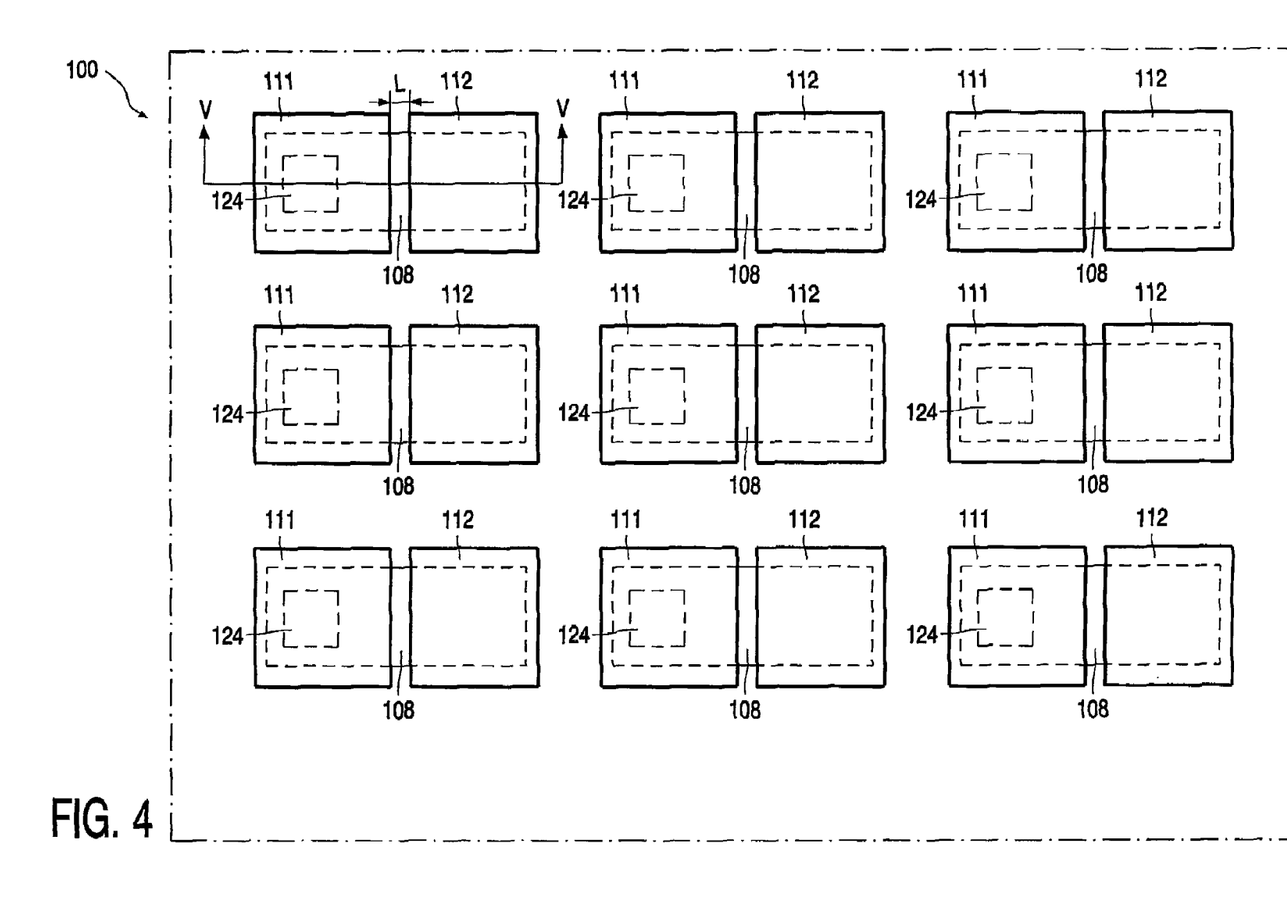
FIG. 4 is a top view of the other embodiment of the electric device at a second stage of the manufacturing.

In a process of manufacturing the electric device 100, first the array of selection devices 171 and the grid of selection lines 120, 121 are formed, e.g. using standard IC technology. One terminal of each selection device 171, in the embodiment of FIGS. 2-9 the source region 172, is provided with an electric conductor 124 such as, e.g., a tungsten plug. The selection device 171, the selection lines 120, 121 and the electric conductor 124 are mutually insulated from each other by and embedded in a dielectric material 123, e.g., silicon dioxide, such that the electric conductor 124 is exposed as shown in FIGS. 2 and 3. Preferably, the surface comprising the exposed electric conductor 124 is polished by chemical mechanical polishing (CMP) for obtaining a smooth and plane surface.

Figure 5:
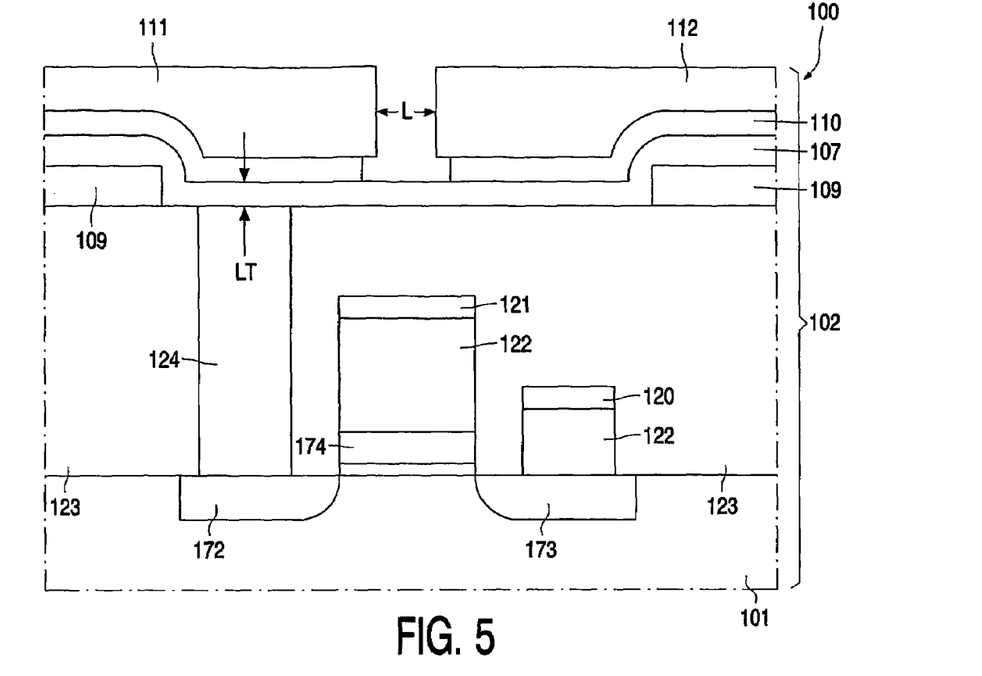
FIG. 5 is a cross-section of the pre-fabricated electric device of FIG. 4 along line V-V.

In a subsequent step this surface is provided with a layer 109 of a dielectric material such as, e.g., silicon nitride or silicon carbide. In the layer 109 openings 108 are formed by means of, e.g., lithography, such that the electric conductors 124 and parts of the dielectric 123 adjacent to the electric conductors 124 are exposed as shown in FIG. 5. Subsequently, the layer 109 and the openings 108 of pre-fabricated electric device 100 thus obtained are provided with a layer 107 of phase change material as shown in FIG. 5. The phase change material may comprise any of the phase change materials of which resistor 7 of the electric device 1 described above is composed. The thickness LT of layer 107 which is typically 5-50 nm, preferably approximately 15 nm, determines the width of the minimal cross-section of the phase change material as will be described below. Onto the layer 107 a layer 110 of a conductive material such as, e.g., TiN may be deposited. Layer 110 is used to reduce the electrical resistance between the electric conductor 124 and the part of layer 107 undergoing the phase change. In another embodiment, not shown, layer 110 is omitted.

Onto layer 107 or, if present, onto layer 110, masks 111 and 112 are formed by, e.g., lithography or electron beam writing. Masks 111 each cover parts of layer 107 and layer 110, if present, which cover the respective electric conductors 124. Masks 112 cover other parts of layer 107 and layer 110, if present, onto which further electric conductors 125 will be formed later on. For every memory element, masks 111 and 112 are separated by a distance L which is typically below 300 nm and preferably between 20 and 200 nm. When lithography is used to form the mask 111 and the mask 112, the minimum distance L is preferably approximately equal to the minimum dimension achievable by the lithography. The shorter the distance L the smaller the electric power required to induce a phase transition between the first and the second phase. The distance L determines the length of the phase change material which will have a cross-section smaller than that of the phase change material at the electric conductors 124 as will be described below. The phase change material having the reduced cross-section is referred to as the volume of the phase change material.

The parts of layer 110 if present, which are not covered by masks 111 and 112 are removed by isotropic selective etching using e.g. an etch comprising HF. The result obtained at this stage of the process of manufacturing the electric device 100 is shown in FIG. 5. Note that due to the isotropic etching an under etch occurs, see FIGS. 5 and 6. Then the parts of layer 107 not covered by masks 111 and 112 are anisotropically etched, using, e.g., a reactive ion etch comprising Cl. As a result sidewall spacers composed of the phase change material are formed inside the openings 108 at the position not covered by masks 111 and 112. This implies reducing a cross-section of a conductive path in the layer 107 between the first contact area covered by mask 111 and a second contact area covered by mask 112. The cross-section is smaller than the first contact area and the second contact area. For each memory element 170 the sidewall spacers formed by layer 107 are electrically connected to those parts of layer 107 and layer 110, if present, which were covered by masks 111 and 112 during the etching step. As shown in the cross-section of FIG. 6 the sidewall spacers formed of layer 107 have a width W that is substantially equal to the thickness LT of layer 107. In other words, the main surface has a step profile formed by layer 109, and the step of reducing the cross-section comprises an anisotropic etching step for forming a sidewall spacer along at least a part of the step profile.

Figure 6:
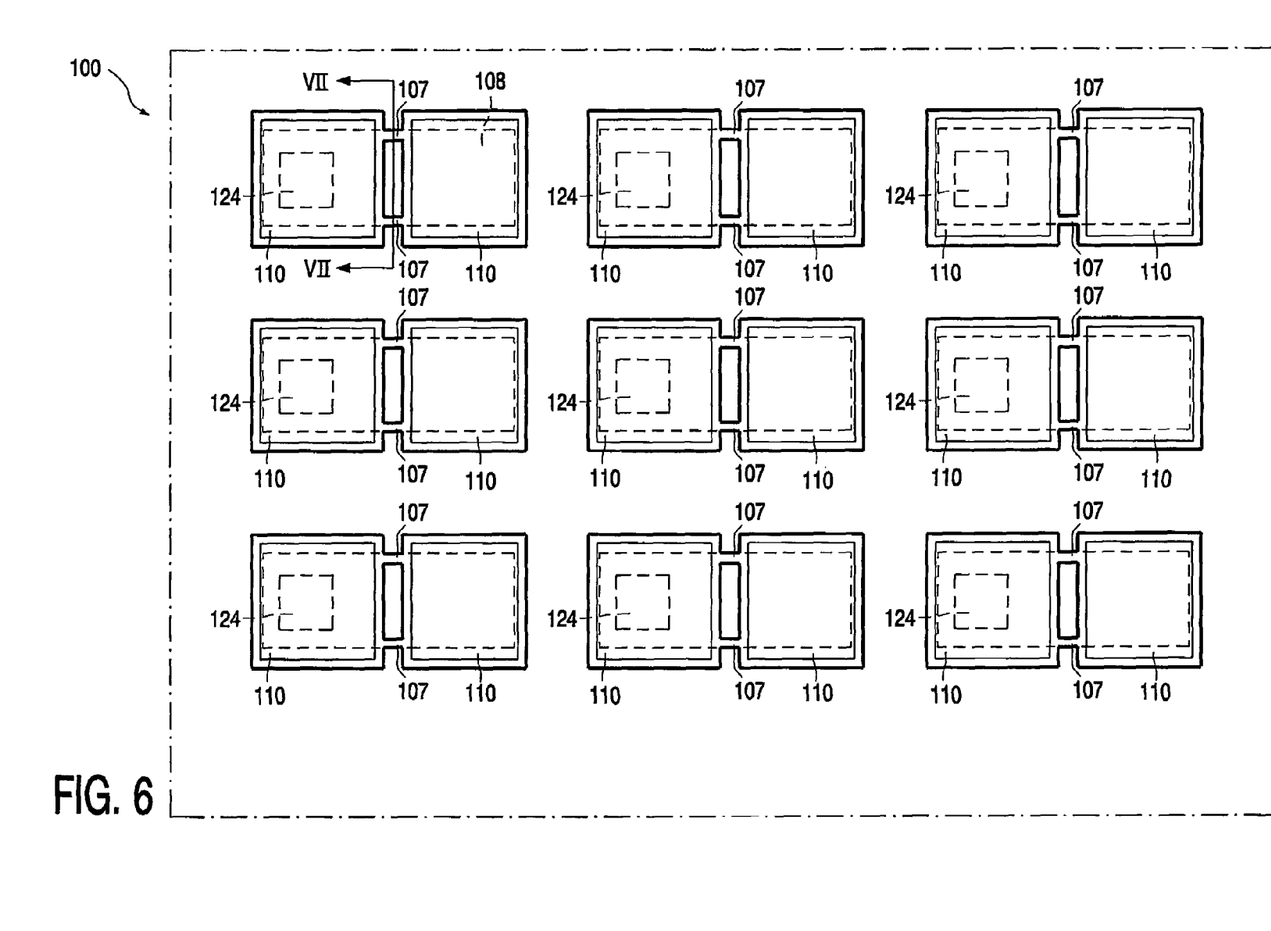
FIG. 6 is a top view of the other embodiment of the electric device at a third stage of the manufacturing.

After removing the masks 111 and 112 the pre-fabricated electric device 100 shown in top view in FIG. 6 is obtained. Every memory cell of this electric device 100 has a layer 107 of phase change material which comprises a part defined by mask 111 and a part defined by mask 112. These two parts are connected by two sidewall spacers formed of layer 107.

In a subsequent step the prefabricated electric device 100 shown in FIG. 6 is covered by a layer of a heating element material which is the same as described above with reference to FIG. 1.

After providing the layer 106 of the heating element material, masks 111' and 112' are formed, which masks are similar to the masks 111 and 112. Subsequently, the layer 106 is anisotropically etched using, e.g., a plasma etch comprising $CF_4:CHF_3$. As shown in the cross-section of FIG. 7 sidewall spacers are formed of layer 106 in a way analogous to the formation of the sidewall spacers of layer 107. The sidewall spacers formed of layer 106 have a width V which is substantially equal to the thickness of layer 106.

In an alternative embodiment layer 107 and layer 106 are interchanged, i.e. layer 106 is provided before providing layer 107 on top of layer 106. In another embodiment layer 106 is separated from layer 107 by an intermediate layer which may comprise, e.g., silicon dioxide. Also in this embodiment the heating element 106 is parallel to the resistor 107. In contrast to the embodiment described before, in this embodiment the resistor 107 is not in direct contact with the heating element 106.

In an alternative embodiment both layer 107 and layer 106 are provided prior to forming the masks 111 and 112. Both layer 107 and layer 106 are then anisotropically etched without the need of an additional step of forming the masks 111' and 112'.

Figure 8:
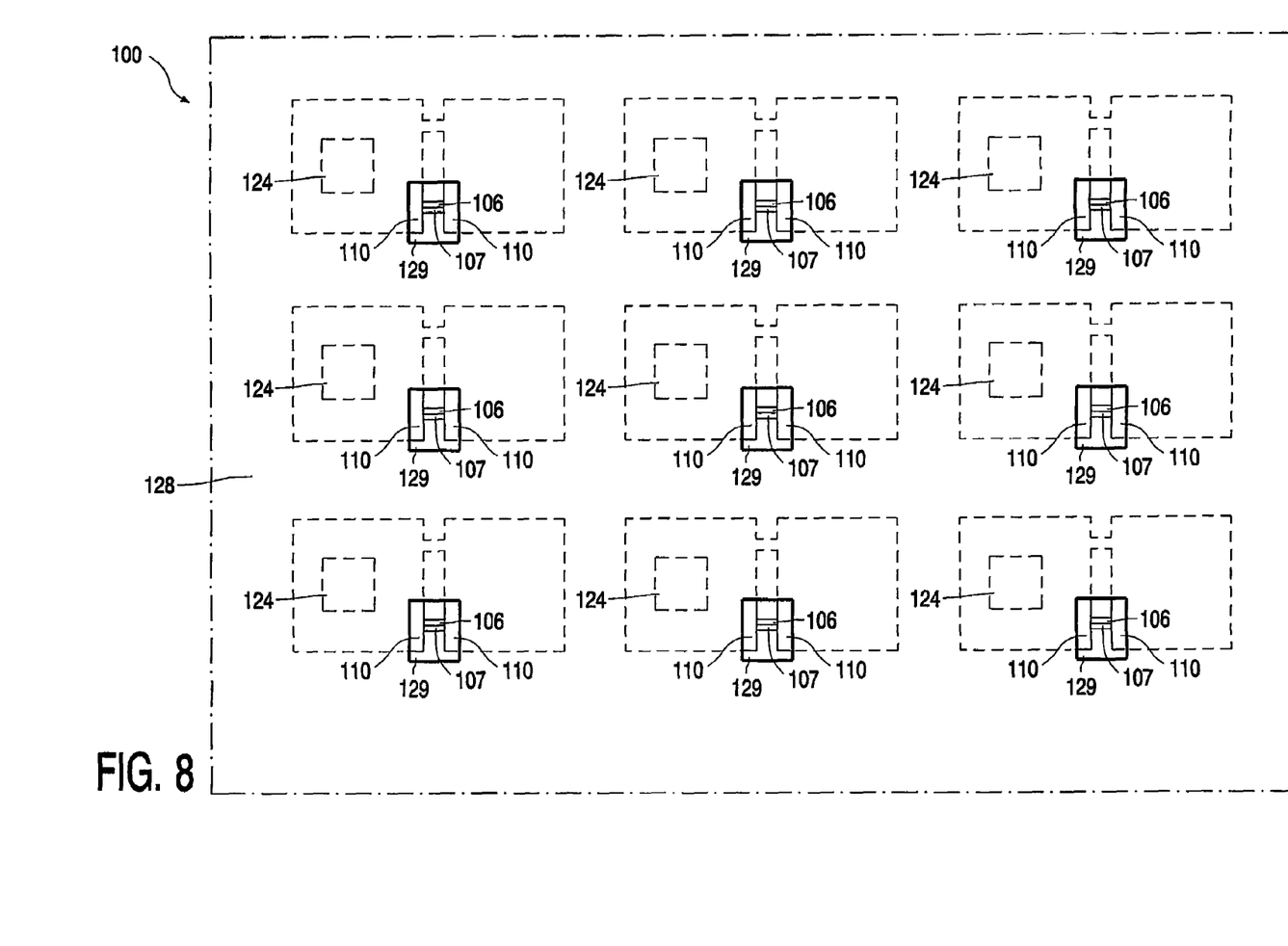

In one embodiment the method of manufacturing the electric device 100 comprises a step in which a mask 128 is provided having openings 129 such that for each of the memory cells one of the two sidewall spacers formed of layer 107 is exposed as shown in FIG. 8. In a subsequent step this mask is then used to remove, e.g. by etching, the exposed portions of layer 106 and layer 107. As a result in every memory cell these two parts are now connected by only one sidewall spacer formed of layer 107. Subsequently, mask 128 is removed. In another embodiment the mask 128 is omitted and the layer 106 and the layer 107 each have two sidewall spacers.

Figure 7:
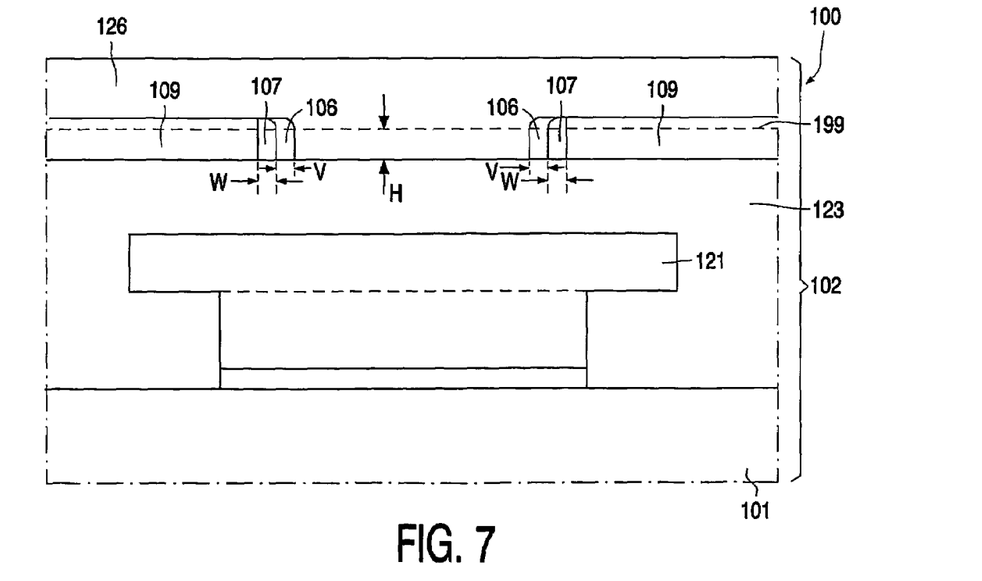
FIG. 7 is a cross-section of the pre-fabricated electric device at a fourth stage along line VII-VII of FIG. 6, FIGS. 8 and 9 are top views of the other embodiment of the electric device at a fifth stage and a sixth stage of the manufacturing, respectively.

The layer 107 thus obtained, i.e. having one or two sidewalls, forms the resistor 170 of the electric device 100. The pre-fabricated electric device 100 is provided with a dielectric layer 126 of, e.g., silicon dioxide. In one embodiment the prefabricated electric device shown in FIG. 7 is then subjected to a material removal treatment, such as, e.g., chemical mechanical polishing, to reduce the height of the sidewall spacers of layers 106 and 107 and to obtain a smooth surface which is advantageous for further processing. It is then advantageous if layer 109 is composed of two layers of different materials, e.g. a lower layer of a relatively hard material such as, e.g., silicon nitride on top of which there is a layer of a relatively soft material such as, e.g., silicon oxide. During the material removal treatment the relatively hard layer is used as a stop layer, resulting in a layer 107 of phase change material of a well-defined height H of preferably 10 to 100 nm. After this material removal treatment surface 199, shown in FIG. 7, is obtained.

Figure 9:
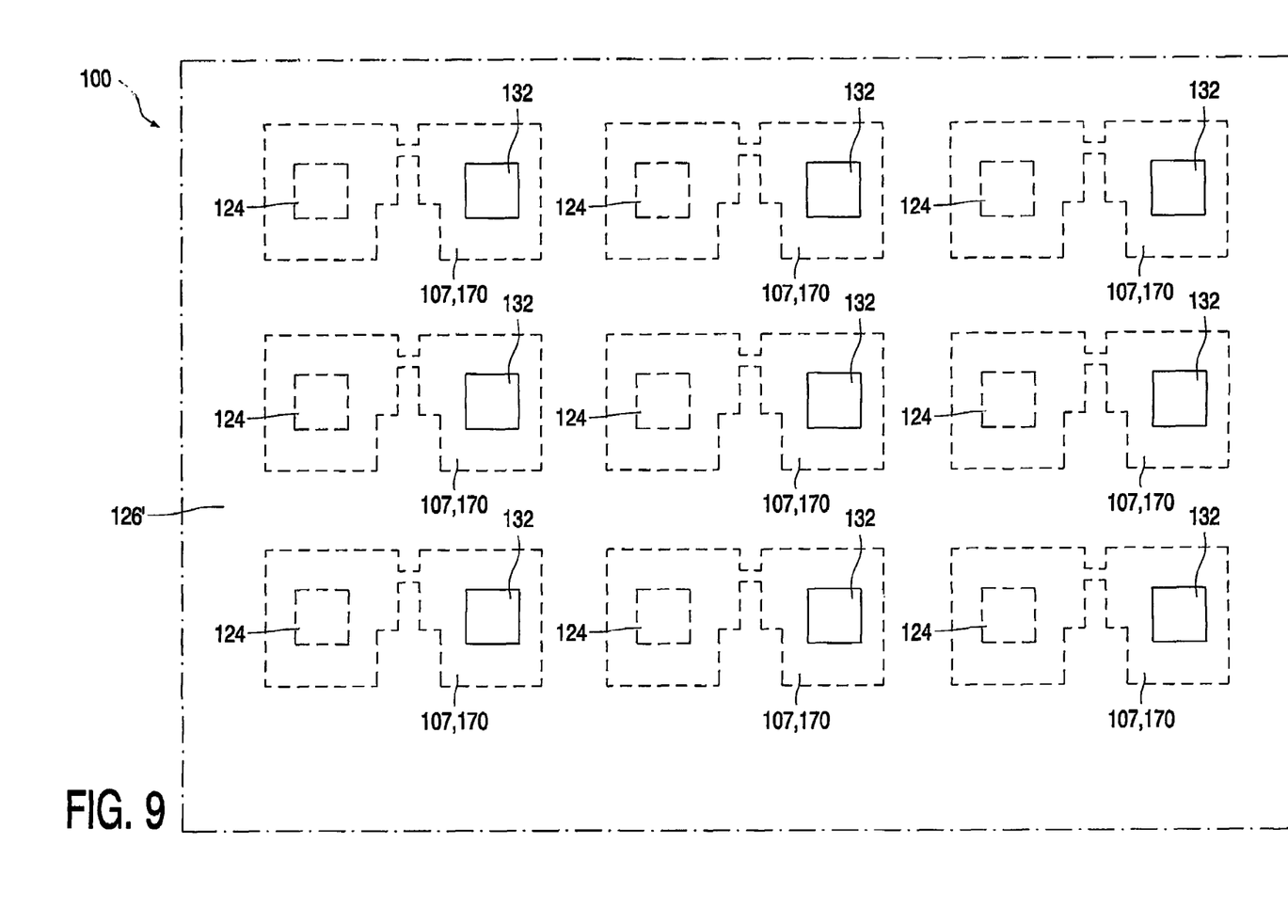

Subsequently, an additional dielectric layer 126' is provided in which openings 132, shown in FIG. 9, are created to expose for each memory cell a part of the layer 106, the conductive layer 110, if present, or layer 107 which was covered by mask 112 at an earlier stage. These openings 132 are provided with further electric conductors for electrically contacting the resistor 170. In a later step the further electric conductor is electrically connected to the output line.

The electric device 100 thus obtained has a body 102 which has a resistor 170. The resistor 170 is composed of a layer 107 of a phase change material being changeable between a first phase and a second phase. The resistor 170 has a first electrical resistance when the phase change material is in the first phase and a second electrical resistance, different from the first electrical resistance, when the phase change material is in the second phase. The body 102 further has a heating element formed by layer 106. The heating element is able to conduct a current for enabling a transition from the first phase to the second phase. The heating element is arranged in parallel with the resistor.

In this embodiment of the electric device 100 the layer 107 of the phase change material constitutes a conductive path between a first contact area and a second contact area. When layer 110 is omitted, the first contact area is the area in which the electric conductor 124 contacts the layer 107 of the phase change material, see e.g. FIGS. 2 and 5, and the second contact area is the area in which the further electric conductor provided to opening 132 contacts the layer 107 of the phase change material, see FIG. 9. A cross-section of the conductive path constituted by the layer of the phase change material is smaller than the first contact area and the second contact area When layer 110 is present, the first contact area and the second contact area are effectively the areas in which the current moves from layer 110 into layer 107. Due to the isotropic etching of layer 110 and the anisotropic etching of layer 107, the layers 110 do not contact the sidewall spacers of layer 107 directly, but at a distance, see FIGS. 5 and 6. In this case, the first contact area and the second contact area are still not at the border of the volume defined by the sidewall spacer and are larger than a cross-section of the sidewall spacer.

The current density inside the sidewall spacer is higher than at the first contact area and at the second contact area and, therefore, the phase change material at the sidewall spacer rather than at the first contact area and/or at the second contact area will undergo a phase transition.

In an embodiment layer 110 is omitted and the volume of the phase change material with the reduced cross-section has a length L of 50 nm, a height H of 20 nm and a width W of 15 nm. The cross-section is thus H times W, which equals 300 $nm^2$. The first contact area defined by electric conductor 124 is equal to the second contact area defined by opening 132, and is equal to 100 nm times 100 nm. Thus the first contact area and the second contact area each have a size of 10000 $nm^2$, which is larger than the cross-section of 300 $nm^2$. The phase change material is $Sb_{72}Te_{20}Ge_8$. The volume of the resistor with the reduced cross section has a resistance of 800 Ohm when the phase change material is in the crystalline phase and of more than 100 kOhm when the phase change material is in the amorphous phase. The electric conductor 124 and the further electric conductor are composed of tungsten. The contact resistance in the first contact area and the second contact area are each 100 Ohm. Thus, the contact resistance at the first contact area and the second contact area are each smaller than the resistance of the volume of the phase change material having the reduced cross-section.

Figure 10:
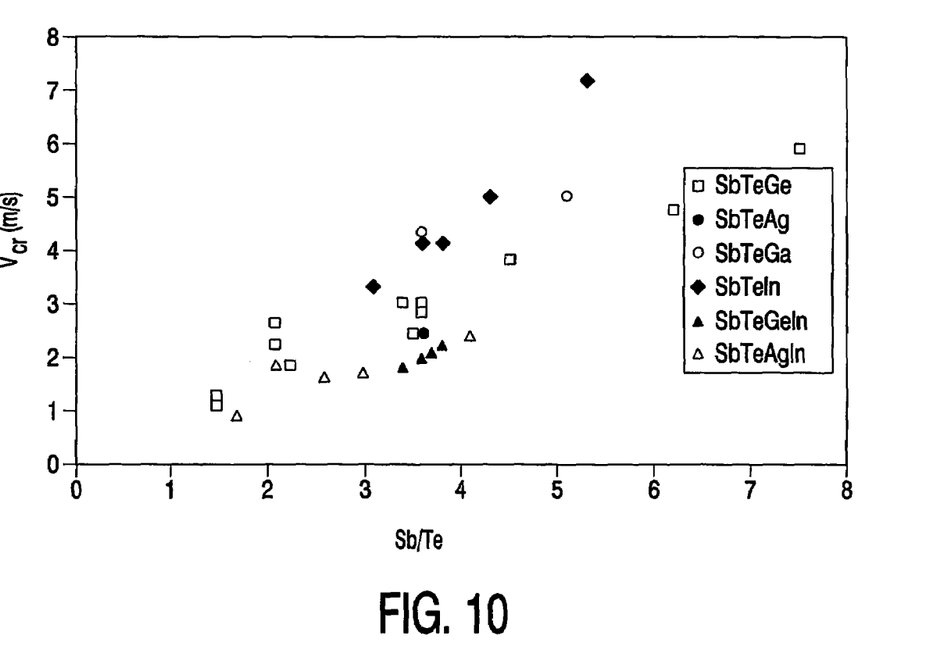
FIG. 10 is a plot of the crystallization speed as a function of the Sb/Te ratio.

The electric device 100 is particularly advantageous when the phase change material is a fast growth material with a crystallization speed of 1 m/s or more. This type of phase change materials which comprise compositions of formula $Sb_{1-c}M_c$, with c satisfying $0.05 \leq c \leq 0.61$, and M being one or more elements selected from the group of Ge, In, Ag, Ga, Te, Zn and Sn, have a crystallization speed $v_{cr}$ which is approximately a linear function of the ratio Sb/M, see e.g. FIG. 10 for the case where M comprises Te. For a given desired switching time t which may be imposed by the bandwidth of the selection device 171, the length L and the composition of the phase change material are adjusted such that $L/(2t) \approx v_{cr}$. Here, the factor 2 accounts for the fact that the crystallization starts from the two outer ends of the volume of the phase change material having the reduced cross-section.

In summary, the electric device 1, 100 has a body 2, 102 having a resistor 7, 107 comprising a phase change material being changeable between a first phase and a second phase. The resistor 7, 107 has a first electrical resistance when the phase change material is in the first phase and a second electrical resistance, different from the first electrical resistance, when the phase change material is in the second phase. The body 2, 102 further has a heating element 6, 106 being able to conduct a current for enabling a transition from the first phase to the second phase. The heating element 6, 106 is arranged in parallel with the resistor 7, 107.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements.

The invention claimed is:

1. An electric device with a body having:
   a resistor comprising a phase change material being changeable between a first phase and a second phase, the resistor having a first electrical resistance when the phase change material is in the first phase and a second electrical resistance, different from the first electrical resistance, when the phase change material is in the second phase, and
   a heating element being able to conduct a current for enabling a transition of the phase change material from the first phase to the second phase by heating the phase change material, the heating element being arranged in parallel with the resistor.

2. An electric device as claimed in claim 1, wherein the heating element has a heating element electrical resistance which is smaller than the maximum of the first electrical resistance and the second electrical resistance.

3. An electric device as claimed in claim 2, wherein the heating element's electrical resistance is larger than 0.3 times the minimum of the first electrical resistance and the second electrical resistance.

4. An electric device as claimed in claim 1, wherein the heating element and the resistor are in direct contact.

5. An electric device as claimed in claim 1, wherein the phase change material constitutes a conductive path between a first contact area and a second contact area, a cross-section of the conductive path having an area that is smaller than the first contact area and the second contact area.

6. An electric device as claimed in claim 5, wherein a part of the conductive path having said cross-section constitutes a volume of phase change material, the volume having an electrical resistance which is smaller than an electrical contact resistance at the first contact area and/or at the second contact area, independent of whether the phase change material is in the first phase or the second phase.

7. An electric device as claimed in claim 1, wherein the heating element material is of a composition $X_{100-(t+s)}Si_sY_t$, where t and s denote atomic percentages satisfying $t<0.7$ and $s+t>0.3$, X comprises one or more elements selected from Ti and Ta, and Y comprises one or more elements selected from C and N.

8. An electric device as claimed in claim 7, wherein X is substantially free from Ti.

9. An electric device as claimed in claim 7, wherein s is smaller than or equal to 0.7.

10. An electric device as claimed in claim 7, wherein Y comprises N.

11. An electric device as claimed in claim 1, wherein the resistor constitutes a memory element, and the body comprises:
    an array of memory cells, each memory cell comprising a respective memory element and a respective selection device, and
    a grid of selection lines, each memory cell being individually accessible via the respective selection lines connected to the respective selection device.

12. An electric device as claimed in claim 11, wherein:
    the selection device comprises a metal oxide semiconductor field effect transistor having a source region, a drain region and a gate region, and
    the grid of selection lines comprises N first selection lines, M second selection lines, and an output line, the resistor of each memory element electrically connecting a first region selected from the source region and the drain region of the corresponding metal oxide semiconductor field effect transistor to the output line, a second region of the corresponding metal oxide semiconductor field effect transistor selected from the source region and the drain region and being free from contact with the first region, being electrically connected to one of the N first selection lines, the gate region being electrically connected to one of the M second selection lines.

* * * * *